(12) United States Patent
Schulze et al.

(10) Patent No.: US 10,217,638 B2
(45) Date of Patent: Feb. 26, 2019

(54) METHOD FOR REMOVING CRYSTAL ORIGINATED PARTICLES FROM A CRYSTALLINE SILICON BODY USING AN ETCH PROCESS

(71) Applicant: Infineon Technologies AG, Neubiberg (DE)

(72) Inventors: Hans-Joachim Schulze, Taufkirchen (DE); Peter Irsigler, Obernberg/Inn (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/584,141

(22) Filed: May 2, 2017

(65) Prior Publication Data
US 2017/0236714 A1     Aug. 17, 2017

Related U.S. Application Data

(63) Continuation of application No. 14/217,913, filed on Mar. 18, 2014, now Pat. No. 9,679,774.

(51) Int. Cl.
| | |
|---|---|
| *H01L 21/225* | (2006.01) |
| *H01L 21/02* | (2006.01) |
| *H01L 21/26* | (2006.01) |
| *H01L 21/265* | (2006.01) |
| *H01L 21/268* | (2006.01) |
| *H01L 21/306* | (2006.01) |

(Continued)

(52) U.S. Cl.
CPC ...... *H01L 21/2257* (2013.01); *H01L 21/0257* (2013.01); *H01L 21/02238* (2013.01); *H01L 21/02524* (2013.01); *H01L 21/02595* (2013.01); *H01L 21/02636* (2013.01); *H01L 21/2605* (2013.01); *H01L 21/268* (2013.01); *H01L 21/26513* (2013.01); *H01L 21/30604* (2013.01); *H01L 21/31105* (2013.01); *H01L 21/324* (2013.01); *H01L 21/3221* (2013.01); *H01L 21/263* (2013.01); *H01L 29/0623* (2013.01)

(58) Field of Classification Search
CPC ......... H01L 21/02238; H01L 21/02595; H01L 21/3221; H01L 21/324
See application file for complete search history.

(56) References Cited

U.S. PATENT DOCUMENTS

| | | |
|---|---|---|
| 4,874,484 A | 10/1989 | Foell et al. |
| 5,863,826 A | 1/1999 | Wu et al. |

(Continued)

FOREIGN PATENT DOCUMENTS

| | | |
|---|---|---|
| CN | 1365403 A | 8/2002 |
| CN | 1632919 A | 6/2005 |
| JP | 2002148462 A | 5/2002 |

OTHER PUBLICATIONS

Pichler, "Intrinsic Point Defects, Impurities and their Diffusion in Silicon", 2004, pp. 103-130.

*Primary Examiner* — Michael Carter
(74) *Attorney, Agent, or Firm* — Murphy, Bilak & Homiller, PLLC

(57) ABSTRACT

A method for removing crystal originated particles from a crystalline silicon body having opposite first and second surfaces includes: increasing a surface area of at least one of the first and second surfaces by an etch process; and oxidizing the increased surface area at a temperature of at least 1000° C. and for a duration of at least 20 minutes.

23 Claims, 6 Drawing Sheets

(51) Int. Cl.
  *H01L 21/311* (2006.01)
  *H01L 21/324* (2006.01)
  *H01L 21/322* (2006.01)
  H01L 21/263 (2006.01)
  H01L 29/06 (2006.01)

(56) References Cited

U.S. PATENT DOCUMENTS

| | | | |
|---|---|---|---|
| 5,902,135 A * | 5/1999 | Schulze | C30B 29/06 257/E21.318 |
| 6,165,914 A * | 12/2000 | Fang | H01L 21/02238 257/E21.285 |
| 2001/0029883 A1 * | 10/2001 | Minami | C30B 15/04 117/20 |
| 2005/0079732 A1 * | 4/2005 | Loo | H01L 21/28273 438/765 |
| 2007/0032089 A1 | 2/2007 | Nuzzo et al. | |
| 2007/0251338 A1 | 11/2007 | Wiese et al. | |
| 2008/0122001 A1 | 5/2008 | Pfirsch et al. | |
| 2011/0147883 A1 * | 6/2011 | Schulze | H01L 21/0237 257/507 |
| 2012/0248576 A1 * | 10/2012 | Schmidt | H01L 21/223 257/607 |

* cited by examiner

METHOD FOR REMOVING CRYSTAL ORIGINATED PARTICLES FROM A CRYSTALLINE SILICON BODY USING AN ETCH PROCESS

BACKGROUND

Semiconductor devices, in particular field-effect controlled switching devices such as a junction field effect transistor (JFET), a metal oxide semiconductor effect transistor (MOSFET) and an insulated gate bipolar transistor (IGBT) are typically used for various applications including but not limited to switches in power supplies and power converters, electric cars, air-conditioners. Such semiconductor devices are typically manufactured on wafer-level. With increasing wafer-size manufacturing costs per chip typically decrease. Larger silicon-wafers, i.e. silicon-wafers with a diameter of at least 12", are currently only available as magnetic Czochralski grown silicon wafers. Silicon-wafers with a diameter of 8" are also available as float zone grown silicon wafers, but are comparatively expensive and may have a comparatively large resistance variation due to striations.

During single-crystal growth using the Czochralski (CZ) method, crystal defects such as crystal originated particles (COPs) or dislocation loops are formed. Agglomerated vacancy-related defects are known commonly as D-defects, or as COPs. Such defects may facilitate the formation of generation centers in the wafer resulting in an enhanced leakage current and weakening of later formed gate dielectrics.

Accordingly, there is a need to remove crystal originated particles from a crystalline silicon body.

SUMMARY

An embodiment refers to a method for removing crystal originated particles from a crystalline silicon body having opposite first and second surfaces. The method comprises increasing a surface area of at least one of the first and second surfaces. The method further comprises oxidizing the increased surface area at a temperature of at least 1000° C. and for a duration of at least 20 minutes.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and together with the description serve to explain principles of the disclosure. Other embodiments and intended advantages will be readily appreciated as they become better understood by reference to the following detailed description.

DETAILED DESCRIPTION

Figure 1:
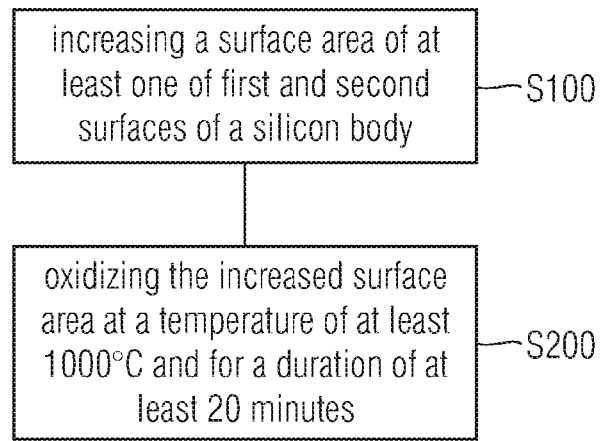
FIG. 1 is a schematic process chart for illustrating a method for removing crystal originated particles from a crystalline silicon body.

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "$n^-$" means a doping concentration that is lower than the doping concentration of an "n"-doping region while an "$n^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

The term "crystal originated particle" (COPs) as used in this specification intends to describe a void in the semiconductor material which is typically formed by an agglomeration of vacancies during crystal growth and may include an outer silicon oxide shell. The risk of forming slip lines in the semiconductor substrate typically increases with the concentration and size of the COPs. Furthermore, COPs which are decorated with in-diffusing heavy metals, like e.g. Fe, Cu, Ni, may act as generation centers enhancing the leakage current of the devices. The diameter of the COPs is typically below about 100 nm, more typically below 80 nm.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n−" means a doping concentration which is less than the doping concentration of an "n"-doping region while an "n+"-doping region has a larger doping concentration than the "n"-doping region. However, indicating the relative doping concentration does not mean that doping regions of the same relative doping concentration have to have the same absolute doping concentration unless otherwise stated. For example, two different n+-doping regions can have different absolute doping concentrations. The same applies, for example, to an n+-doping and a p+-doping region.

Specific embodiments described in this specification pertain to, without being limited thereto, to semiconductor devices, in particular to field effect semiconductor transistors and manufacturing methods therefor. Within this specification the terms "semiconductor device" and "semiconductor component" are used synonymously. The semiconductor device typically includes a field-effect structure. The field-effect structure may be a MOSFET or an IGBT-structure having a pn-junction forming a body diode between a drift region of the first conductivity type and a body region of the second conductivity type. The semiconductor device is typically a vertical semiconductor device having two load metallizations, for example a source metallization and a drain metallization for a MOSFET, which are arranged opposite to each other and in low resistive contact with a respective contact region. The field-effect structure may also be formed by a JFET-structure.

By way of example, the semiconductor device is a power semiconductor device having an active area with, for example, a plurality of IGBT-cells or MOSFET-cells for carrying and/or controlling a load current between the two load metallizations. Furthermore, the power semiconductor device has typically a peripheral area with at least one edge-termination structure at least partially surrounding the active area when seen from above.

The term "power semiconductor device" as used in this specification intends to describe a semiconductor device on a single chip with high voltage and/or high current switching capabilities. In other words, power semiconductor devices are intended for high current, typically in the 10 Ampere to a few kA range. Within this specification the terms "power semiconductor device" and "power semiconductor component" are used synonymously.

The term "field-effect" as used in this specification intends to describe the electric-field mediated formation of a conductive "channel" of a first conductivity type and/or control of conductivity and/or shape of the channel between two regions of the first conductivity type. The conductive channel may be formed and/or controlled in a semiconductor region of a second conductivity type, typically a body region of the second conductivity type, which is arranged between the two regions of the first conductivity type. Due to the field-effect, a unipolar current path through the channel region is formed and/or controlled between a source region or emitter region of the first conductivity type and a drift region of the first conductivity type in a MOSFET-structure and an IGBT-structure, respectively. The drift region may be in contact with a higher doped drain region of the first conductivity type or a higher doped collector region of the second conductivity type, respectively. The drain region or the collector region is in low resistive electric contact with a drain or collector electrode. The source region or emitter region is in low resistive electric contact with a source or emitter electrode. In a JFET-structure, the channel region is typically formed by a portion of the drift region of the first conductivity type arranged between a gate region and a body region of the second conductivity type, and may be controlled by changing the width of a depletion layer formed between the gate region and the channel region.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively.

In the context of the present specification, the term "gate electrode" intends to describe an electrode which is situated next to, and configured to form and/or control a channel region. The term "gate electrode" shall embrace an electrode or conductive region which is situated next to, and insulated from the body region by an insulating region forming a gate dielectric region and configured to form and/or control a channel region through the body region by charging to an appropriate voltage.

By way of example, the gate electrode is implemented as trench-gate electrode, i.e. as a gate electrode which is arranged in a trench extending from the main surface into the semiconductor substrate or body. The gate electrode may also be implemented as a planar gate electrode.

A unit cell of an active area of a power field-effect semiconductor device may, in a horizontal cross-section, include a trench-gate electrode and a surrounding portion of a mesa when the trench-gate electrodes form a two-dimensional lattice, for example in the form of a checker board, when seen from above.

Alternatively, the unit cell of the active area of a power field-effect semiconductor device may, in a horizontal cross-section, include a trench-gate electrode and a respective portion of two adjoining mesas when seen from above. In these embodiments, trench-gate electrodes, mesas and unit cells may form respective one-dimensional lattices.

In the context of the present specification, the term "mesa" or "mesa region" intends to describe a semiconductor region which is, in a vertical cross-section, arranged next to one and typically between two adjacent trenches extending into the semiconductor substrate or body.

The conductive regions for forming the gate electrode and the field electrode, respectively, may be made of a material with high enough electric conductivity so that the conductive region forms an equipotential region during device operation. For example, the conductive region may be made of a material with metallic or near-metallic electric conductivity such as a metal, for example wolfram, highly doped poly-silicon, a suicide or the like. Typically, the conductive region is in resistive electric connection with a gate metallization of the semiconductor device. The insulating region may be made of any suitable dielectric material such as silicon oxide, for example thermal silicon oxide, silicon nitride, siliconoxynitride or the like.

In the context of the present specification, the term "metallization" intends to describe a region or a layer with metallic or near metallic properties with respect to electric conductivity. A metallization may be in contact with a semiconductor region to form an electrode, a pad and/or a terminal of the semiconductor device. The metallization may be made of and/or comprise a metal such as Al, Ti, W, Cu and Co but may also be made of a material with metallic or near metallic properties with respect to electric conductivity such as highly doped n-type or p-type poly-Si, TiN or an electrically conductive silicide such as TaSi2, TiSi2, PtSi, CoSi2, WSi2 or the like. The metallization may also include different electrically conductive materials, for example a stack of those materials.

FIG. 1 is a schematic process chart for illustrating a method for removing COPs from a crystalline silicon body.

Process feature S100 comprises increasing a surface area of at least one of first and second surfaces of a crystalline silicon body.

Process feature S200 comprises oxidizing the increased surface area at a temperature of at least 1000° C., or even at least 1050° C., or even at least 1100° C. and for a duration of at least 20 minutes, or even at least 1 hour. According to an embodiment, the oxidation is carried out in a wet ambient.

According to an embodiment, the crystalline silicon body is a silicon wafer. The silicon wafer may be a Czochralski (CZ) wafer, e.g. grown by the standard CZ method or by the magnetic CZ (MCZ) method or by the continuous CZ (CCZ) method. The CZ wafer may serve as a base material for manufacturing a variety of semiconductor devices and integrated circuits such as power semiconductor devices and solar cells, for example.

During the oxidation of silicon, interstitial silicon atoms are generated at the oxidizing surface and diffuse into the crystalline silicon body. The generated interstitial silicon atoms moving into a bulk of the crystalline silicon body occupy vacancies in the crystal lattice, thereby dissolving COPs by filling accumulations of vacancies or voids of the COPs. The process may also lead to a breakup of an oxide layer lining an inner surface of the COPs.

By increasing the surface area of the at least one of the first and second surfaces of the crystalline silicon body, an amount of interstitial silicon atoms generated during the oxidation can be increased leading to a more effective dissolution of the COPs due to an increased concentration of interstitial silicon atoms, i.e. the required oxidation temperature can be reduced e.g. from 1100° C. to 1000° C. or 1050° C. and/or the duration of the oxidation can be shortened to e.g. the half time.

According to an embodiment, the process of oxidizing the increased surface area comprises a moist/wet oxidation process. By way of example, the crystalline semiconductor body may be oxidized in moist air. By way of another example, the crystalline semiconductor body may be oxidized in a gaseous doping material compound containing oxygen. Phosphorus oxytrichloride ($POCl_3$) one example of such an oxygen containing compound.

According to an embodiment, the duration of the process of oxidizing the increased surface area is between 1 hour and 5 hours, or between 2 and 4 hours.

According to an embodiment, the process of oxidizing the increased surface area is carried out in a temperature range between 1000° C. and 1300° C. By way of example, the oxidation may be carried out at a temperature between 1080° C. and 1180° C., e.g. around 1150° C. for a $POCl_3$ diffusion. According to an embodiment, after oxidation by means of phosphorus oxytrichloride, phosphorus-doped zones generated by the diffusion with $POCl_3$ may be removed, e.g. by an etch process.

Figure 2A:
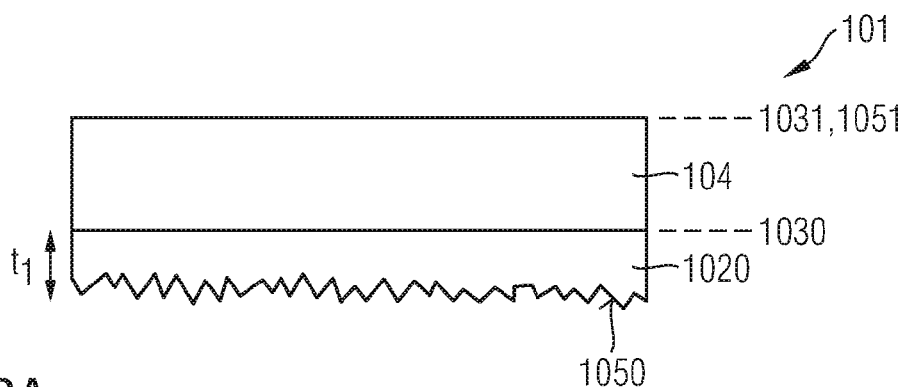
FIGS. 2A and 2B are schematic cross-sectional views illustrating a method for increasing a surface area of a crystalline silicon body by forming a polysilicon layer at a surface of the crystalline silicon body.

Referring to the schematic cross-sectional view of a crystalline silicon body 101 illustrated in FIG. 2A, an embodiment of a process for increasing a surface area of the crystalline silicon body 101 comprises forming a first polysilicon layer 1020 at a first side 1030 of a crystalline silicon substrate 104, e.g. a CZ silicon wafer. Since a surface roughness of the first polysilicon layer 1020 at a first surface 1050 of the crystalline silicon body 101 is greater than a surface roughness at the first side 1030 of the crystalline silicon substrate 104, the surface area of the crystalline silicon body 101 is increased. By way of example, the first polysilicon layer 1020 may be formed by a chemical vapor deposition (CVD) process, e.g. by atmospheric pressure chemical vapor deposition (APCVD) and/or by low pressure chemical vapor deposition (LPCVD), for example. The increased surface area of the first surface 1050 of the crystalline silicon body 101 compared with the surface roughness at the first side 1030 of the crystalline silicon substrate 104 is due to a composition of a number of randomly associated crystallites of silicon in the first polysilicon layer 1020 which determines the surface area at the first surface 1050 of the crystalline silicon body 101.

According to an embodiment, a thickness $t_1$ of the first polysilicon layer 1020 is between 500 nm and 2 μm.

Figure 2B:
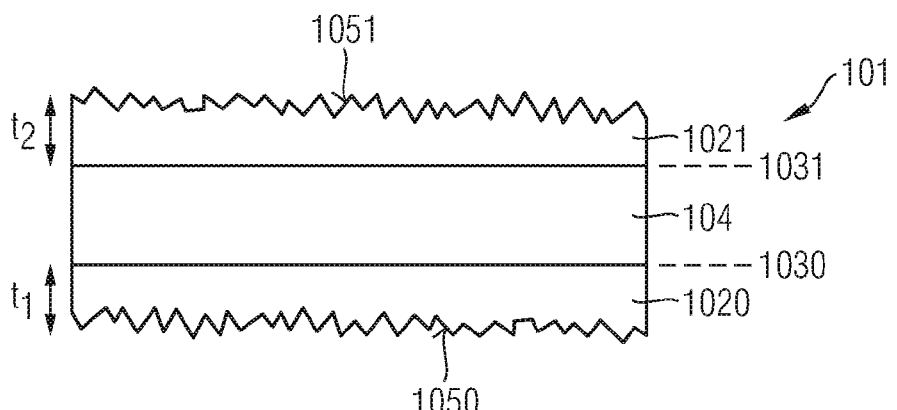

The surface area of the crystalline silicon body 101 may also be increased with respect to opposite sides as is illustrated in the schematic cross-sectional view of FIG. 2B. In the illustrated embodiment of FIG. 2B, the first polysilicon layer 1020 is formed at the first side 1030 of the crystalline silicon substrate 104 leading to the increased surface area at the first surface 1050 similar to the embodiment illustrated in FIG. 2A. In addition, a second polysilicon layer 1021 is formed at a second side 1031 of the crystalline silicon substrate 104 leading to an increased surface area at a second surface 1051 of the crystalline silicon body 101. Thicknesses $t_1$, $t_2$ of the first and second polysilicon layers 1020, 1021 may be equal, e.g. when forming the first and second polysilicon layers 1020, 1021 by a common process. By way of another example, the thicknesses $t_1$, $t_2$ of the first and second polysilicon layers 1020, 1021 may also differ from each other, e.g. when forming the first and second polysilicon layers 1020, 1021 one after another by different processes.

After increasing the surface area of the first and/or second surfaces 1050, 1051 of the crystalline silicon body 101, and after oxidizing the increased surface area for removing COPs from the crystalline silicon body 101 by interstitial diffusion, the polysilicon layer(s) 1020, 1021 may be removed followed by processes for manufacturing a semiconductor device in the crystalline silicon body 101, for example. According to another embodiment, the polysilicon layer 1020 and/or the polysilicon layer 1021 may remain as a gettering layer during further processing of the crystalline silicon body 101. The oxide layer on the polysilicon layer may remain during following processes or may be removed. An oxide layer on a side of the silicon body 101 having no polysilicon layer may be removed partially or even completely. An additional annealing step performed for example in a hydrogen containing atmosphere at a temperature ranging for example between 800° C. and 1200° C., or between 900° C. and 1100° C., may be performed afterwards to smoothen COP induced surface imperfections on the side of the silicon body 101 having no polysilicon layer.

According to an embodiment, formation of the first and/or second polysilicon layer 1020, 1021 comprises doping the first and/or second polysilicon layer 1020, 1021 with at least $10^{17}$ cm$^{-3}$ of phosphorus, or even at least $10^{19}$ cm$^{-3}$ of phosphorus. Phosphorus doping in the first and/or second polysilicon layer 1020, 1021 allows for an increased injection of interstitial silicon into the crystalline silicon body 101 due to an increase of an oxidation rate caused by the presence of the phosphorus doping. In addition, an efficiency of gettering in the first and/or second polysilicon layer 1020, 1021 can be increased leading to a reduction or suppression of heavy metal insertion by diffusion from outside of the crystalline silicon body 101.

Figure 3:
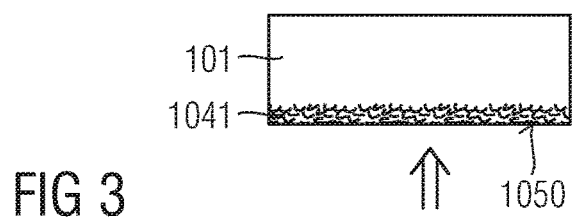
FIG. 3 is a schematic cross-sectional view illustrating a method for increasing a surface area of a crystalline silicon body by forming a porous layer at a surface of the crystalline silicon body.

Another embodiment of increasing the surface area of the crystalline silicon body 101 illustrated in the schematic cross-sectional view of FIG. 3. The process of increasing the surface area of the crystalline silicon body 101 comprises forming a porous layer 1041 at the first surface 1050. By way of example, electrochemical anodization of the crystalline silicon body 101 in diluted aqueous or ethanoic hydrofluoric acid (HF) may be used to form the porous layer 1041. Ethanol may be added for removing H$_2$ bubbles emerging during the etch process. Further examples for manufacturing the porous silicon layer 1041 comprise stain etching or chemical etching (without current flow). Pore widths may range from less than 2 nm (micro pores), between 2 and 50 nm (meso pores) to widths larger than 50 nm (macro pores), for example.

Figure 4:
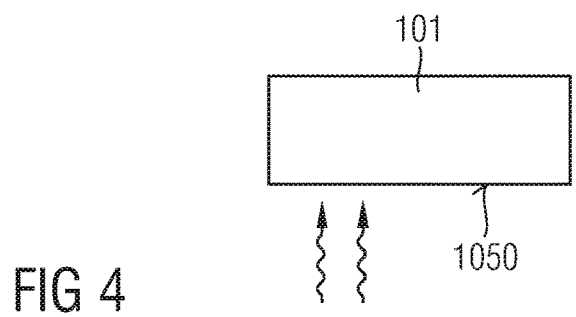
FIG. 4 is a schematic cross-sectional view illustrating a method for increasing a surface area of a crystalline silicon body by irradiating a surface of the crystalline silicon body with laser irradiation.

Yet another embodiment of increasing the surface area of the crystalline silicon body 101 is illustrated in the schematic cross-sectional view of FIG. 4. In the illustrated embodiment of FIG. 4, the surface area at the first surface 1050 of the crystalline silicon body 101 is increased by irradiating the first surface 1050 with a laser beam configured to locally melt the crystalline silicon body 101 at the first surface 1050. Recrystallization of the crystalline silicon body 101 leads to an increased surface roughness at the first surface 1050.

Figure 5:
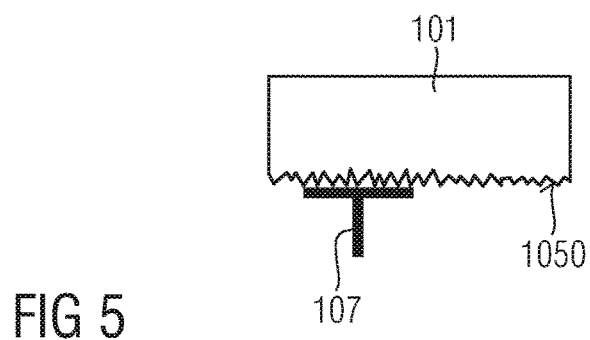
FIG. 5 is a schematic cross-sectional view illustrating a method for increasing a surface area of a crystalline silicon body by a machining process.

Another embodiment of increasing a surface area of the crystalline silicon body 101 is illustrated in the schematic cross-sectional view of FIG. 5. In the illustrated embodiment of FIG. 5, the process of increasing the surface area of the crystalline silicon body 101 comprises a machining process. A machining tool 107 acts on the first surface 1050 for increasing the surface area. Examples of the machining process comprise metal cutting, abrasive processes such as grinding and/or lapping, and cutting, for example. The machining process may be followed by surface cleaning process. Examples of the surface cleaning process comprise anyone or any combination of wet chemical cleaning such as common RCA-cleaning, cleaning under ultra-high-vacuum (UHV) conditions such as thermal desorption, cleaning processes using oxygen and/or ozone such as carbon burning and processes using hydrogen such as heating in H$_2$ ambient.

Figure 6:
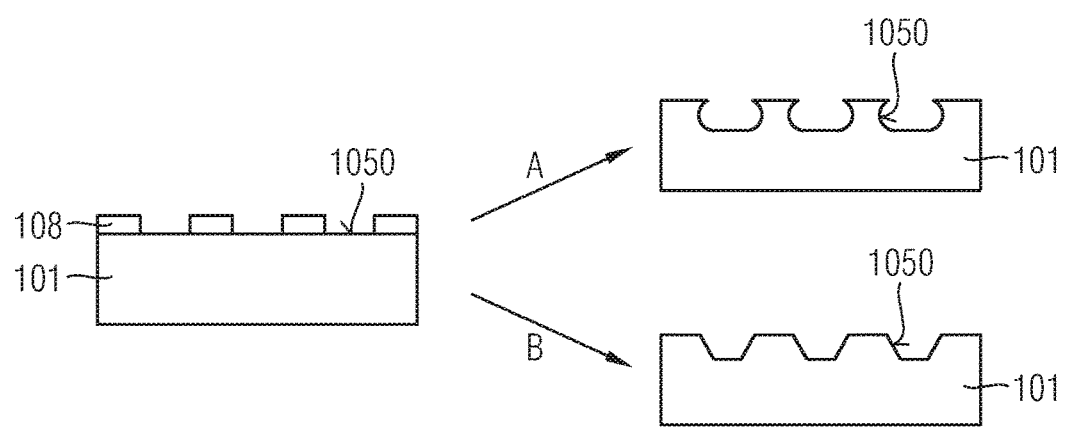
FIG. 6 is a schematic cross-sectional view illustrating a method for increasing a surface area of a crystalline silicon body by a masked etch process.

Yet another embodiment of increasing the surface area of the crystalline silicon body 101 is illustrated in the schematic cross-sectional view of FIG. 6. In the illustrated embodiment of FIG. 6, an etch mask layer 108 is formed at the first surface 1050 of the crystalline silicon body 101 and patterned, e.g. by a lithographic process for patterning a hard mask layer or a resist layer.

Thereafter, an etch process is applied to the first surface 1050. When applying an isotropic etch process to the first surface 1050 of the crystalline silicon body 101, e.g. by isotropic wet etching, an increased surface area at the first surface 1050 similar to the cross-sectional view of the crystalline silicon body 101 indicated by an arrow A in FIG. 6 may result.

When applying an anisotropic etch process to the first surface 1050 of the crystalline silicon body 101, e.g. by an anisotropic dry etch process such as reactive ion etching or anisotropic wet etching with hydroxides such as potassium hydroxide (KOH), an increased surface area at the first surface 1050 similar to the schematic cross-sectional view of the crystalline silicon body 101 indicated by an arrow B in FIG. 6 may result.

Figure 7A:
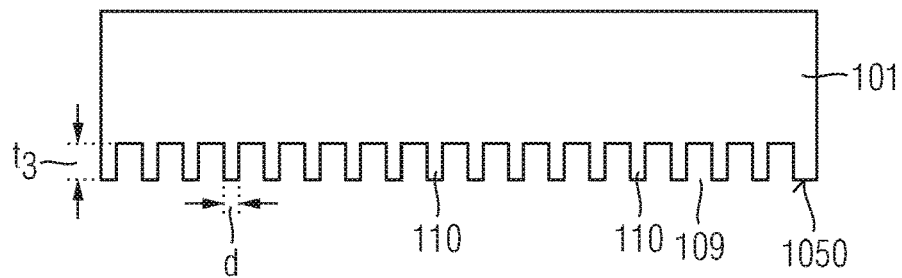
FIGS. 7A to 7D are schematic cross-sectional views illustrating methods for increasing a surface area of a crystalline silicon body by forming trenches.

Anisotropic etching may also result in a plurality of trenches 109 at the first surface 1050 of the crystalline silicon body 101 as illustrated in the schematic cross-sectional view of FIG. 7A.

According to an embodiment, the process of increasing the surface area of at least one of the first and second surfaces 1050, 1051 provides an increase of the surface area by at least 30%, or even by at least 50%, or even by more than a factor of two. Anyone or any combination of the processes described with reference to FIGS. 2A to 7A may be used. The process of increasing the surface area may be applied to a part or all of the first and/or the second surfaces 1050, 1051. According to an embodiment, the trenches 109 or a part of the trenches 109 formed at the first surface 1050 or the crystalline silicon body 101 may be used as device-specific elements of trench-based semiconductor devices such as gate trenches comprising a gate electrode, a gate dielectric and an optional field electrode, for example. In addition or as an alternative, the trenches 109 or a part of the trenches 109 formed at the first surface 1050 of the crystalline silicon body 101 may be used for realizing compensation structures within a drift zone. Thus, the trenches 109 may serve at first for providing an increased surface area in the process of removing COPs from the crystalline silicon body 101 and may then be integrated as device-specific elements in the process of manufacturing a semiconductor device in the crystalline silicon body 101. A depth $t_3$ of the trenches 109 illustrated in the embodiment of FIG. 7A may also vary, e.g. be increased to a depth $t_4$ as is illustrated in the schematic cross-sectional view of the crystalline silicon body 101 of FIG. 7B.

According to an embodiment, trenches 109 having different depths may be formed at the first surface 1050 and/or the second surface 1051. According to an embodiment, a ratio between a depth of the plurality of trenches 109 and a thickness of the crystalline silicon body 101 ranges between 0.5% and 100%, or between 1% and 50%.

Figure 7B:
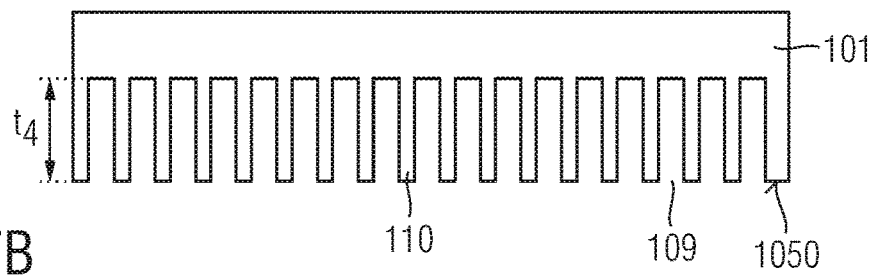
Figure 7C:
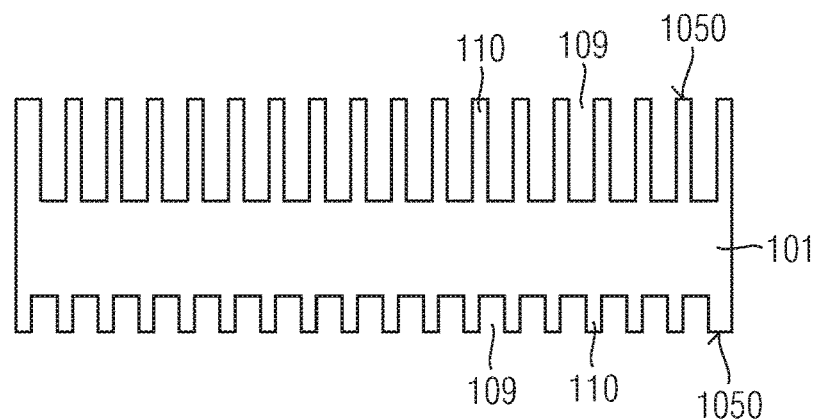

As is illustrated in the schematic cross-sectional view of the crystalline silicon body 101 of FIG. 7C, the trenches 109 are formed at the first and second surfaces 1050, 1051. As is further illustrated in the cross-sectional view of the crystalline silicon body 101 of FIG. 7D, the trenches 109 may also extend through the crystalline silicon body 101. In this case, but also for other cases, an extension of the trenches 109 into a third dimension perpendicular to the drawing plane may be limited to a range between 1 µm to 100 µm, or to a range between 3 µm to 50 µm.

According to an embodiment and after formation of the trenches 109 as illustrated in anyone or in any combination of FIGS. 7A to 7D, at least one of an oxygen concentration and a nitrogen concentration in the crystalline silicon body 101 is reduced by diffusing oxygen and/or nitrogen out of the crystalline silicon body 101. The increased surface area at the first and/or second surfaces 1050, 1051 caused by the presence of the trenches 109 allows for an increased out-diffusion of oxygen and/or nitrogen.

According to an embodiment, the concentration of nitrogen in the crystalline silicon body 101 is reduced by at least by a factor of 2, or by at least a factor of 5 in a mesa region 110 between opposite trenches 109. The process of diffusing the nitrogen out of the crystalline silicon body 101 may be carried out at a temperature in a range between 900° C. and 1050° C., for example. According to an embodiment, the nitrogen concentration after diffusing the nitrogen partially out of the crystalline silicon body 101 may be smaller than $2 \times 10^{14}$ cm$^{-3}$.

According to another embodiment, an oxygen concentration in the crystalline silicon body 101 drops by at least 10%, or by at least 50%, or even by at least a factor of 2 starting from a depth of 10 µm from the first and/or second surface 1050, 1051 to the first and/or second surface 1050, 1051, respectively.

According to an embodiment, a depth of the trenches 109 is between 3 µm and 250 µm. According to another embodiment, a width of the trenches 109 is between 1 µm and 30 µm. A distance d between neighboring two of the trenches 109, i.e. a width of the mesa region 110 may be between 1 µm and 30 µm, for example. In this case, but also for other cases, an extension of the trenches 109 into a third dimension perpendicular to the drawing plane may be limited to a range between 1 µm to 100 µm, or to a range between 3 µm to 50 µm.

According to an embodiment, a depth of the trenches 109 and an extension of a space charge region into the depth of the crystalline silicon body 101 at a maximum blocking voltage specified for the device to be formed in the crystalline silicon body 101 deviate by less than 50%, or less than 30%, or even less than 10%. The depth of the trenches 109 may be adjusted to the maximum blocking voltage specified for the device to be formed in the crystalline silicon body 101, for example.

Diffusion of impurities such as nitrogen and/or oxygen and/or any dopants out of the crystalline silicon body 101 allows for a reduction or a suppression of undesired background doping by oxygen and/or nitrogen in a base material used for manufacturing a semiconductor device. Outdiffusion of e.g. boron or phosphorus allows to realize a base material or starting material with a high resistivity in the region of the epitaxially filled trenches.

Figure 7D:
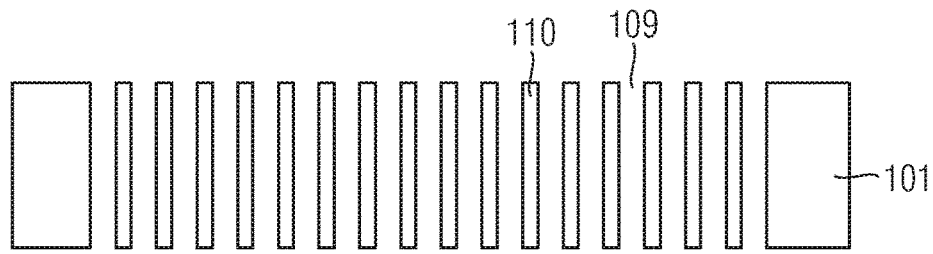

Forming the trenches 109 at opposite sides of the crystalline silicon body 101 as illustrated in FIG. 7C or forming the trenches 109 extending through the crystalline silicon body 101 as illustrated in FIG. 7D is beneficial for an effective removal of COPs from the crystalline silicon body 101 by interstitial diffusion and is further beneficial for an effective diffusion of oxygen and/or nitrogen and/or undesired doping atoms out of the crystalline silicon body 101, thereby reducing or suppressing undesired background doping by oxygen and/or nitrogen and/or phosphorus and/or boron and/or other dopants.

FIGS. 8A to 8D illustrate schematic plan views of a crystalline silicon body 101 comprising different layouts of trenches formed in the crystalline silicon body 101 for increasing a surface area.

Figure 8A:
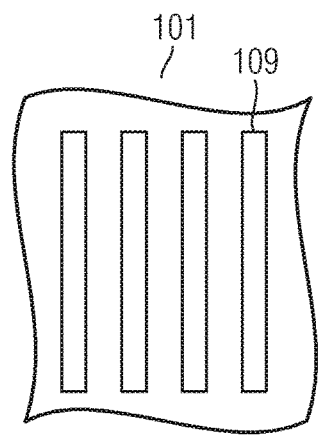
FIGS. 8A to 8D are schematic plan views of a crystalline silicon body comprising different shapes of trenches.

Referring to the schematic plan views of the crystalline silicon body 101 of FIG. 8A, the trenches 109 extend as stripes in parallel to each other.

Figure 8B:
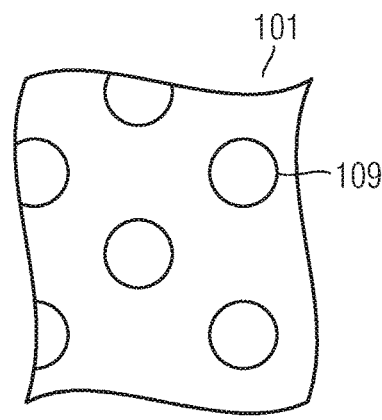

Referring to the schematic plan view of the crystalline silicon body 101 of FIG. 8B, the trenches 109 are circular and regularly arranged.

Figure 8C:
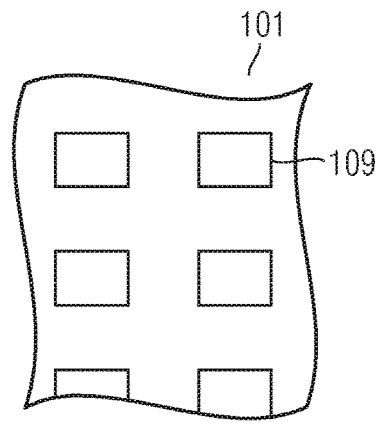

Referring to the schematic plan views of the crystalline silicon body 101 of FIG. 8C, the trenches 109 are square and regularly arranged.

The trenches 109 or part of the trenches 109 may also be in the shape of an ellipse, a polygon, e.g. a hexagon, a closed loop, e.g. a ring, or any combination of different shapes.

Figure 8D:
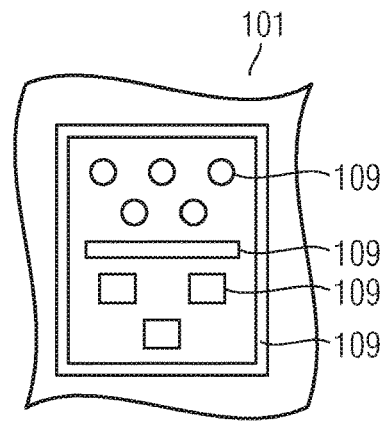

The schematic plan view of the crystalline silicon body 101 of FIG. 8D illustrates a combination of different trench shapes including circle, square, stripe, closed loop. The different shapes of trenches may be regularly or irregularly arranged. According to an embodiment, arrangement and dimensions of the trenches is chosen with due regard to optimizing removal of COPs from the crystalline silicon body 101 by the process illustrated in FIG. 1 as well as reduction or suppression of undesired background doping by oxygen and/or nitrogen in the crystalline silicon body 101 by out-diffusion.

Figure 9A:
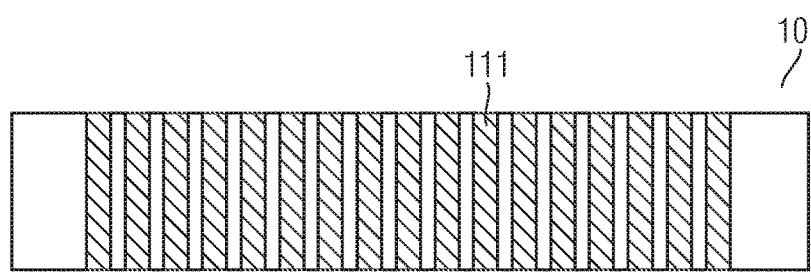
FIGS. 9A and 9B are schematic cross-sectional views of a crystalline silicon body after filling trenches with a doped material and diffusion of dopants into the crystalline silicon body.

Following the process illustrated in FIG. 1 and/or reduction or suppression of undesired background doping by oxygen and/or nitrogen and/or boron and/or phosphorus and/or other dopants in the crystalline silicon body 101 by out-diffusion, according to an embodiment illustrated in FIG. 9A, the trenches 109 are filled by lateral epitaxial growth in areas 111. Forming the trenches 109 with a taper may facilitate avoidance of voids in the areas 111.

According to an embodiment, the lateral epitaxial growth comprises in-situ doping.

Figure 9B:
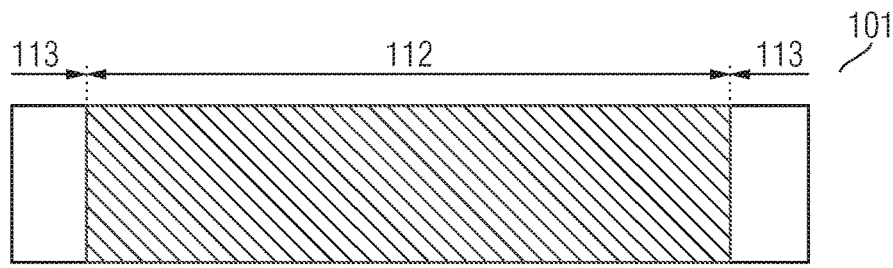

Referring to the schematic-cross sectional view of the crystalline silicon body 101 of FIG. 9B, dopants introduced into the areas 111 are partly diffused out of the areas 111 and into surrounding parts of the crystalline silicon body 101, e.g. by applying an appropriate thermal budget by heating. Depending on the thermal budget and on subsequent thermal budgets during manufacture of a semiconductor device in the crystalline silicon body 101, a lateral undulation of a doping profile may be adjusted. The above method allows for a division of the crystalline silicon body 101 into parts having different doping, the parts laterally adjoining each other. By way of example, the above method allows to set a target doping in an inner area 112 of the crystalline silicon body 101 and to remain with a background doping of the crystalline silicon body 101 in an area 113, e.g. an edge area surrounding the inner area 112.

Filling of the trenches 109 by lateral epitaxial growth has been illustrated based on an arrangement of trenches 109 as illustrated in FIG. 7D. Lateral epitaxial growth may be carried out regardless of the trench arrangement, i.e. also with regard to trench arrangements as illustrated in FIGS. 7A to 7C, for example. After filling the trenches 109 by lateral epitaxial growth, one or more than one semiconductor layer, e.g. epitaxial semiconductor layers may be formed on one or opposite sides of the crystalline silicon body 101, for example. Formation of one or more than one semiconductor layer, e.g. epitaxial semiconductor layer(s) on one or opposite sides of the crystalline silicon body 101 is not limited to the embodiments illustrated in FIGS. 7A to 7D, but may be carried out with respect to any other embodiment after process feature S200 illustrated in FIG. 1, for example.

According to another embodiment, an in-diffusion of dopants through a sidewall and/or the bottom of the trenches 109 can be carried out prior to a filling of the trenches. This allows for manufacturing buried field stop zones, and subsequent high-temperature processes can be appropriately chosen such that the dopants introduced e.g. through the bottom of the trenches 109 diffuse along a lateral direction so far that there is an overlap of diffusion region of neighboring trenches 109. If there is no overlap, structured field stop layers can be realized resulting e.g. in an improved softness of the turn-off behavior of power semiconductor devices and reduced overvoltage peaks.

According to another embodiment, the areas 111 are intrinsic or lightly doped and doping of the crystalline silicon body 101 is carried out by proton irradiation from one or opposite sides of the crystalline silicon body 101 followed by thermal annealing, e.g. by an annealing process in a temperature range between 300° C. and 520° C., thereby generating hydrogen-related donors in the crystalline silicon body 101. In addition to proton irradiation, electron irradiation may be carried out for improving homogeneity of doping between opposite sides of the crystalline silicon body 101 caused by electron-irradiation generated vacancies in the crystalline silicon body 101.

Figure 10A:
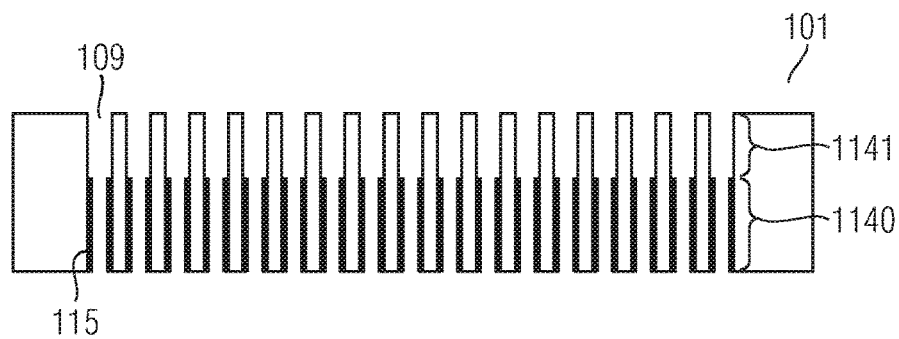
FIGS. 10A to 10H illustrate front-end-of-line (FEOL) and back-end-of line (BEOL) processing after processing of the crystalline silicon body as illustrated in FIG. 1.

Referring to the embodiment illustrated in the cross-sectional view of FIG. 10A, a first part 1140 of the trenches 109 is lined with a first dielectric material 115, e.g. an oxide such as a $SiO_2$. A second part 1141 of the trenches 109 remains uncovered.

Figure 10B:
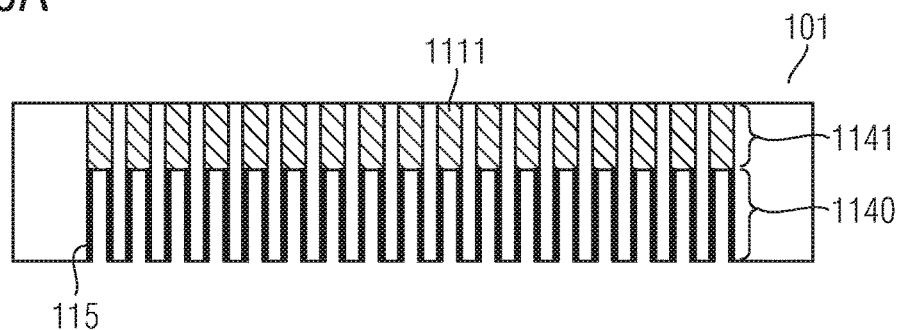

By forming the first dielectric material 115 only in the first part 1140 of the trenches 109, the second part 1141 of the trenches 109 may be filled by lateral epitaxial growth and in-situ doped as is illustrated in the schematic cross-sectional view of FIG. 10B, see region 1111.

Figure 10C:
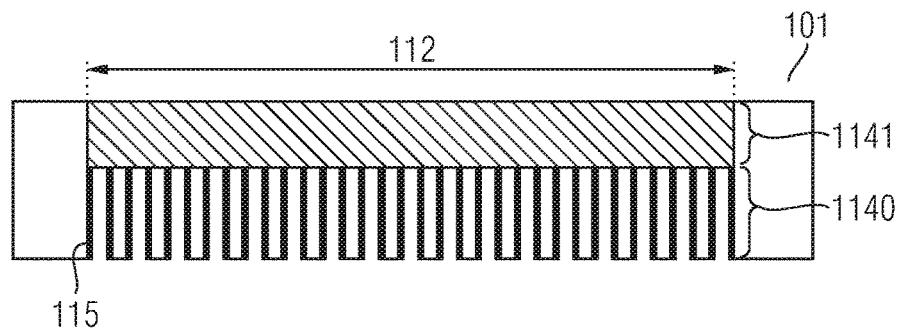

Similar to the embodiment illustrated in FIGS. 9A and 9B, dopants introduced into the second part 1141 may be partly diffused out into surrounding parts of the crystalline silicon body 101 as illustrated in the cross-sectional view of FIG. 10C, e.g. by applying an appropriate thermal budget by heating. Thereby the inner area 112 of the crystalline silicon body 101 may be doped.

Figure 10D:
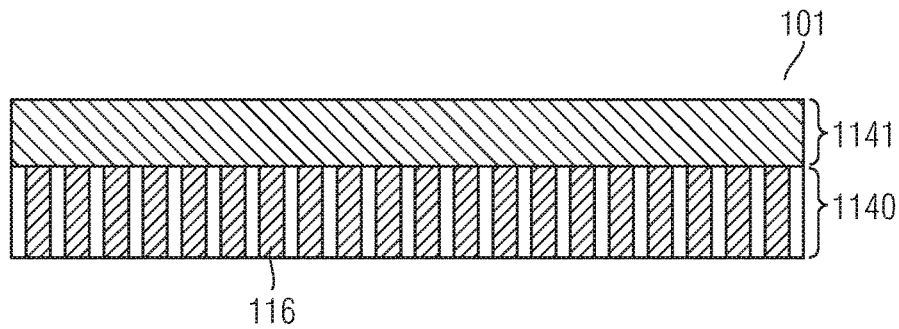

Referring to the schematic cross-sectional view of the crystalline silicon body of FIG. 10D, the trenches 109 in the first part 1140 are filled with a second dielectric material 116 or a combination of materials. The first dielectric material 115 may optionally be removed before formation of the second dielectric material 116.

Figure 10E:
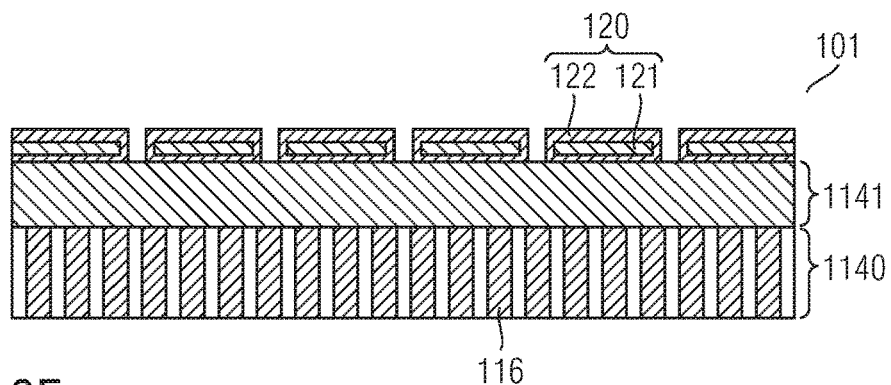

Further processes for manufacturing a semiconductor device in the crystalline silicon body 101 follow. By way of example and representative for a vast variety of processes, formation of a gate structure 120 comprising a gate electrode 121 and a gate dielectric 122 is illustrated in FIG. 10E. The processes for manufacturing the semiconductor device in the crystalline silicon body 101 may include front-end-of-line (FEOL) processing comprising processes such as semiconductor well or zone formation by diffusion or implantation of dopants, formation of conducting and insulating layers, and planarization, for example.

Figure 10F:
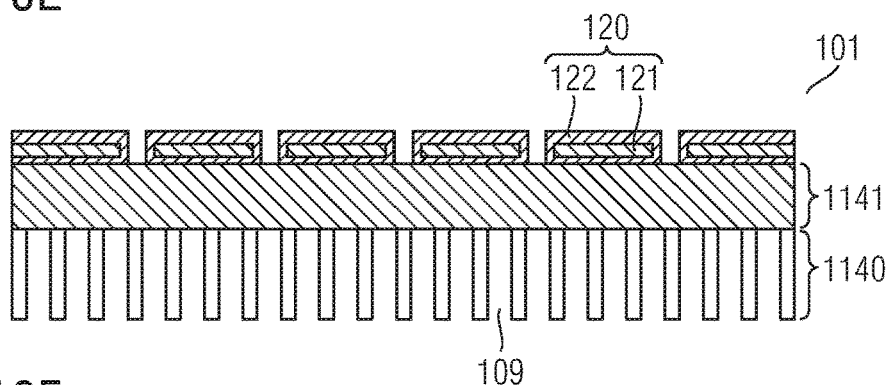

Referring to the schematic cross-sectional view of the crystalline silicon body 101 of FIG. 10F, the second dielectric material 116 is removed from the first part 1140 of the trenches 109, e.g. by an etch process.

Figure 10G:
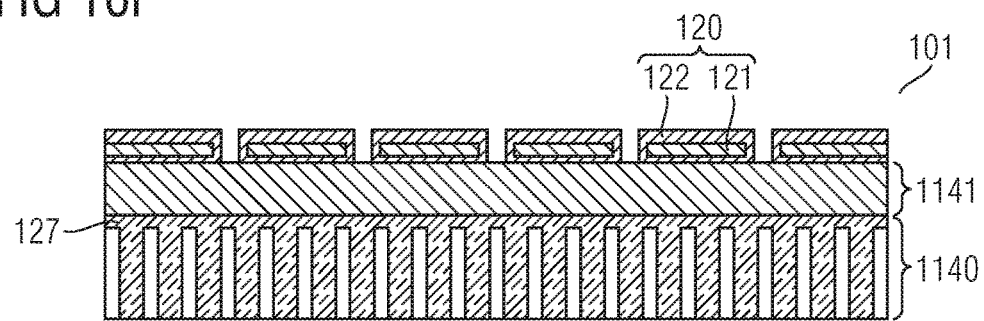

Referring to the schematic cross-sectional view of the crystalline silicon body 101 of FIG. 10G, a contact layer 127 may be formed at a bottom side and sidewalls of the trenches 109, e.g. by introducing dopants through sidewalls and a bottom side of the trenches 109 into a surrounding part of the crystalline silicon body 101. The dopants may be introduced by one or a combination of diffusion out of the gas phase, diffusion out of the solid phase and ion implantation, for example.

Figure 10H:
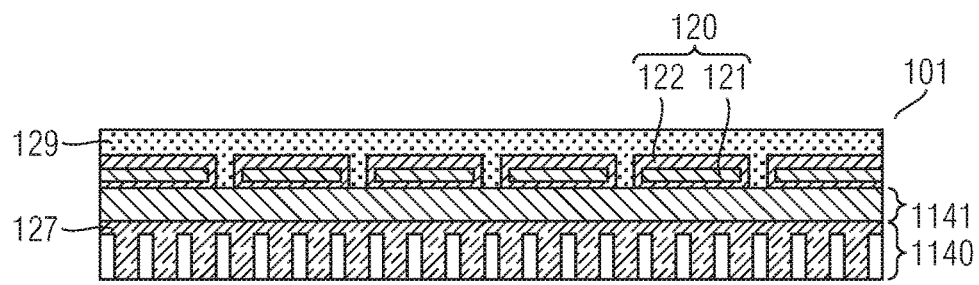

Referring to the schematic cross-sectional view of the crystalline silicon body 101 of FIG. 10H, back-end-of-line (BEOL) processing may follow including, inter alia, formation of a passivation layer 129, e.g. an imide on the crystalline silicon body 101 and/or wafer thinning. In some embodiments, the wafer thinning process removes the layer with enhanced surface roughness.

The FEOL and BEOL processing of the crystalline silicon body 101 that has undergone the processes illustrated in FIG. 1 may result in any desired semiconductor device such as a semiconductor diode, an insulated gate bipolar transistor (IGBT), a bipolar transistor, a field effect transistor (FET), a solar cell, an integrated circuit.

Although specific embodiments have been illustrated and described herein, it will be appreciated by those of ordinary skill in the art that a variety of alternate and/or equivalent implementations may be substituted for the specific embodiments shown and described without departing from the scope of the present invention. By way of example, the semiconductor regions denoted p-doped or n-doped in the illustrated embodiments may also be doped vice versa, i.e. the semiconductor regions denoted p-doped may be n-doped and the semiconductor regions denoted n-doped may be p-doped. This application is intended to cover any adaptations or variations of the specific embodiments discussed herein. Therefore, it is intended that this invention be limited only by the claims and the equivalents thereof.

What is claimed is:

1. A method for removing crystal originated particles from a crystalline silicon body having opposite first and second surfaces, the method comprising:
   increasing a surface area of at least one of the first and second surfaces by an etch process, the etch process comprising etching a plurality of trenches into the crystalline silicon body;
   oxidizing the increased surface area at a temperature of at least 1000° C. and for a duration of at least 20 minutes; and
   forming at least one of: an electrically conductive electrode and semiconductor material in the plurality of trenches after the oxidizing.

2. The method of claim 1, wherein oxidizing the increased surface area comprises a moist oxidization process.

3. The method of claim 1, wherein a duration of oxidizing the increased surface area is between 1 hour and 5 hours.

4. The method of claim 1, wherein oxidizing the increased surface area is carried out in a temperature range between 1000° C. and 1300° C.

5. The method of claim 1, further comprising removing at least part of the oxidized surface area.

6. The method of claim 5, further comprising annealing the crystalline silicon body in a hydrogen containing atmosphere at temperatures greater than 800° C.

7. The method of claim 1, wherein the etch process comprises locally etching the at least one of the first and second surfaces.

8. The method of claim 1, wherein a depth of the plurality of trenches is between 3 μm and 250 μm and a width of the plurality of trenches is between 1 μm and 30 μm.

9. The method of claim 1, wherein a distance between neighboring ones of the plurality of trenches is between 1 μm and 30 μm.

10. The method of claim 1, further comprising filling the plurality of trenches by lateral epitaxial growth.

11. The method of claim 10, wherein the lateral epitaxial growth comprises in-situ doping.

12. The method of claim 10, further comprising:
doping the crystalline silicon body by proton irradiation through at least one of the first and second surfaces; and
subsequently annealing the crystalline silicon body in a temperature range between 300° C. and 520° C.

13. The method of claim 10, further comprising doping the crystalline silicon body by generating vacancies in the crystalline silicon body by electron irradiation.

14. The method of claim 10, further comprising, after filling the trenches, forming a semiconductor layer on the crystalline silicon body at a side comprising at least part of the plurality of trenches filled by lateral epitaxial growth.

15. The method of claim 1, further comprising forming the plurality of trenches at the first and second surfaces.

16. The method of claim 1, wherein a ratio between a depth of the plurality of trenches and a thickness of the crystalline silicon body ranges between 0.5% and 100%.

17. The method of claim 1, further comprising reducing an impurity concentration in the crystalline silicon body by a thermal process for diffusing at least part of the impurities out of the crystalline silicon body.

18. The method of claim 1, wherein increasing the surface area of at least one of the first and second surfaces yields an increase of the surface area by at least 30%.

19. The method of claim 1, wherein oxidizing the increased surface area is carried out at a temperature of at least 1100° C.

20. The method of claim 1, further comprising forming a semiconductor layer on the crystalline semiconductor body.

21. The method of claim 1, wherein the etch process is a masked etch process.

22. A method for removing crystal originated particles from a crystalline silicon body having opposite first and second surfaces, the method comprising:
increasing a surface area of at least one of the first and second surfaces by an etch process; and
oxidizing the increased surface area at a temperature of at least 1000° C. and for a duration of at least 20 minutes,
wherein the etch process comprises forming a porous layer at one or both of the first and second surfaces.

23. A method for removing crystal originated particles from a crystalline silicon body having opposite first and second surfaces, the method comprising:
increasing a surface area of at least one of the first and second surfaces by an etch process;
wherein the etch process comprising etching a plurality of trenches into the crystalline silicon body;
oxidizing the increased surface area at a temperature of at least 1000° C. and for a duration of at least 20 minutes;
introducing dopants through at least one of sidewalls and a bottom side of the plurality of trenches; and
filling the plurality of trenches with semiconductor material after the introducing of the dopants.

* * * * *